(12) United States Patent
Fischeneder et al.

(10) Patent No.: US 9,521,743 B2
(45) Date of Patent: Dec. 13, 2016

(54) PRINTED CIRCUIT BOARD WITH CROSSTALK REDUCTION FEATURES

(71) Applicant: AT&S Austria Technologie & Systemtechnik Aktiengesellschaft, Leoben (AT)

(72) Inventors: Martin Fischeneder, Behamberg (AT); Mikael Tuominen, Shanghai (CN)

(73) Assignee: AT&S Austria Technologie & Systemtechnik Aktiengesellschaft, Leoben (AT)

( * ) Notice: Subject to any disclaimer, the term of this patent is extended or adjusted under 35 U.S.C. 154(b) by 0 days.

(21) Appl. No.: 14/653,222

(22) PCT Filed: Dec. 12, 2013

(86) PCT No.: PCT/AT2013/050248
§ 371 (c)(1),
(2) Date: Jun. 17, 2015

(87) PCT Pub. No.: WO2014/094020
PCT Pub. Date: Jun. 26, 2014

(65) Prior Publication Data
US 2015/0366051 A1    Dec. 17, 2015

(30) Foreign Application Priority Data
Dec. 21, 2012    (CN) .......................... 2012 2 0717145

(51) Int. Cl.
*H05K 1/09* (2006.01)
*H05K 1/02* (2006.01)
(Continued)

(52) U.S. Cl.
CPC .......... *H05K 1/0218* (2013.01); *H05K 1/0298* (2013.01); *H05K 1/0366* (2013.01);
(Continued)

(58) Field of Classification Search
CPC .. H05K 1/0218; H05K 3/1216; H05K 1/0298; H05K 1/0366; H05K 1/092; H05K 2201/0723
(Continued)

(56) References Cited

U.S. PATENT DOCUMENTS

| 2003/0080826 A1 | 5/2003 | Chen et al. |
| 2004/0128822 A1 | 7/2004 | Tung et al. |

(Continued)

FOREIGN PATENT DOCUMENTS

| EP | 238267 A2 | 9/1987 |
| EP | 384644 A1 | 2/1990 |
| EP | 1951009 A1 | 7/2008 |

OTHER PUBLICATIONS

International Preliminary Report on Patentability for International Application No. PCT/AT2013/050248, Report issued Jan. 4, 2015, Mailed Jan. 4, 2015, 13 Pgs.
(Continued)

*Primary Examiner* — Tremesha S Willis
(74) *Attorney, Agent, or Firm* — KPPB LLP

(57) ABSTRACT

A printed circuit board comprising conductive layers separated by insulation layers of dielectric material, at least one conductive layer being patterned and having at least one signal line embedded in insulation material. The at least one signal line is covered by a dielectric film, followed by a thin conductive layer, whereby the dielectric film covers at least one surface and both sides of the at least one signal line and the thin conductive layer extends, separated by the dielectric film, over the at least one surface of the signal line and at least partially over the height of both sides of the signal line.

9 Claims, 1 Drawing Sheet

(51) Int. Cl.
*H05K 1/03* (2006.01)
*H05K 3/12* (2006.01)

(52) U.S. Cl.
CPC ........... *H05K 1/092* (2013.01); *H05K 3/1216* (2013.01); *H05K 2201/0723* (2013.01); *H05K 2203/013* (2013.01)

(58) Field of Classification Search
USPC .................. 174/251, 250, 253, 255–258
See application file for complete search history.

(56) References Cited

U.S. PATENT DOCUMENTS

2011/0220405 A1   9/2011   Tsunoi et al.
2012/0187581 A1   7/2012   Shimada et al.

OTHER PUBLICATIONS

International Search Report for International Application No. PCT/AT2013/050248, Search completed, Apr. 1, 2014 Mailed Aug. 4, 2014, 4 Pgs.

PRINTED CIRCUIT BOARD WITH CROSSTALK REDUCTION FEATURES

CROSS REFERENCE TO RELATED APPLICATIONS

This application is a national phase 35 U.S.C. §371 filing of PCT Application No. PCT/AT2013/050248 filed on Dec. 12, 2013 which claims priority to Chinese Application No. 201207145. X filed on Dec. 21, 2012, the disclosures of Which are hereby incorporated by reference in their entireties.

BACKGROUND OF THE INVENTION

Field of the invention

The present invention relates to a printed circuit board (PCB) and in particular to a printed circuit board comprising conductive layers separated by insulation layers of dielectric material, at least one conductive layer being patterned and having at least one signal line embedded in an insulation material.

Description of the Related Art

Increasing miniaturization and extreme electronic component density as well as the necessity to transfer large amounts of data at high speed, can create serious problems with respect to signal integrity in PCBs. A specific problem here is the desire to configure signal lines with predetermined impedance. In order to avoid signal losses due to reflexions at interfaces with other signal lines, it is necessary to adjust the line impedance already during the manufacture of a PCB as accurately as possible. Leakage currents, which should be as small as possible, constitute a further problem. A further problem, typically for high speed lines, is associated with return currents in high-frequency applications, leading to an uncontrolled impedance of the transmission line, build by a signal line and a ground plane. A further problem is given by crosstalking and electromagnetic noise, received and/or emitted by signal lines, since the current paths may be considered as an antenna, receiving and transmitting signal energy, thereby creating electromagnetic interference.

EP 1 443 811 A2 deals with some of these problems and discloses a multilayer PCB with signal lines suitable for systems operating at 800 MHz and more.

Due to the limited space it is not expedient to use all the recommended measures used in conventional circuit design for avoiding cross-talking and electromagnetic noise, e.g. widening of spaces between signal lines, which would lead to an undesirable increase of the thickness of the PCB as such.

FIG. 1 is a cross sectional view of a PCB having three conducting layers and three dielectric insulation layers. In this example of a conventional PCB 1 on a support core 2 there is arranged a first structured conductive layer 3 made of conductive material, mostly copper, including two signal lines 4, 5 followed by a first prepreg-layer 6, a second conductive layer 7, which may be structured and may contain a signal line 8, followed by a second prepreg-layer 9 and, arranged on said second prepreg layer 9, a third uppermost conductive layer 10 which may be structured in a well-known manner too. Crosstalking can occur between the two signal lines 4, 5 or between these signal lines 4, 5 and signal line 8 or other components of the PCB, not shown.

Further it should be noted that the impedance of the signal transmission line is a function, amongst others, of the distance between the signal lines 4, 5 and ground, defined primarily by the conductive layer 7, the width of the lines 4, 5 and the relative permittivity $\epsilon_r$ of dielectric layer 6. At a given width of a signal line higher impedance may be reached by using a dielectric layer with a low relative permittivity $\epsilon_r$ and/or by increasing the distance between a signal line 4, 5 and the conductive layer 7. Since the relative permittivity is determined in most cases by the commercially available materials, mostly prepregs, FR4, Polyimide etc., one have to increase the distance between the signal lines 4, 5 and the conductive layer 7, which leads to an undesirable increase of the thickness of the PCB as such. Further problems are cross-talking and interferences: areas where high speed signals are close to each other are the most critical areas to get noise or disturbance from the adjacent signals.

It is further to mention that in order to reduce loss of electrical signal in high-frequency applications the PCB must show low dielectric constant and low dielectric loss.

SUMMARY

An object of the present invention is to provide a PCB with signal lines with improved signal integrity, e.g. with reduced problems caused by the creation of electromagnetic interference.

Quite another aspect of the present invention is to provide a PCB with reduced crosstalking between signal lines and/or components.

An object of the present invention is to provide a PCB with signal lines, having a predefined impedance.

Another object of the invention is the provision of a PCB with signal lines having, despite of small thickness, reduced loss in high-frequency regions.

Thus the present invention provides a printed circuit board comprising conductive layers separated by insulation layers of dielectric material, at least one conductive layer being patterned and having at least one signal line embedded in an insulation material. The at least one signal line is covered by a dielectric film, followed by a thin conductive layer, whereby the dielectric film covers at least one surface and both sides of the at least one signal line and the thin conductive layer extends, separated by the dielectric film, over the at least one surface of the signal line and at least partially over the height of both sides of the signal line.

In preferred embodiments the dielectric film is an epoxy film, which may be a screen printed film, a laminated film or an ink jetted film.

Preferably the thin conductive layer is made of carbon paste, of silver paste or of copper paste.

A preferred embodiment of the invention comprises at least a support core, a first structured conductive layer including the at least one signal line arranged on the support core, followed by a first prepreg-layer with the dielectric film and the thin conductive layer, and a second conductive layer. In an advantageous modification the second conductive layer is followed by a second prepreg-layer and a third conductive layer.

DETAILED DESCRIPTION

Figure 1:
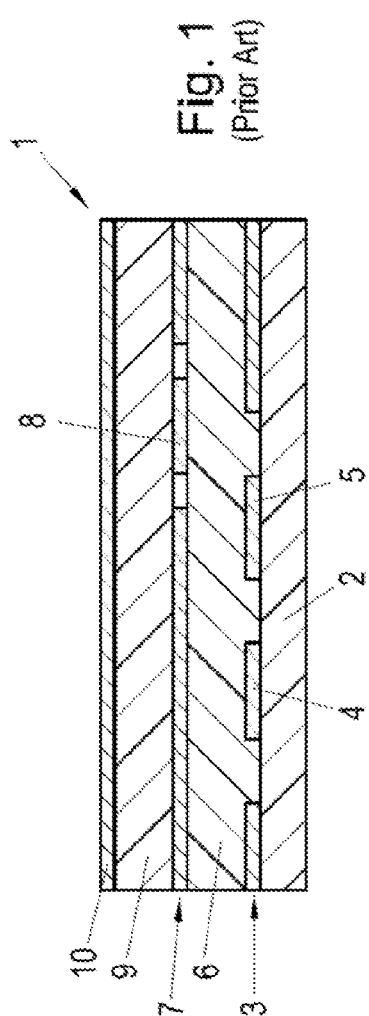
FIG. 1 is a schematic cross-sectional view of a PCB having two signal lines according to the prior art.

Embodiments of a PCB according to the invention will be described below in more detail with reference to the accompanying drawings. For same or similar components same reference numerals are used in order to avoid redundant explanations.

Figure 2:
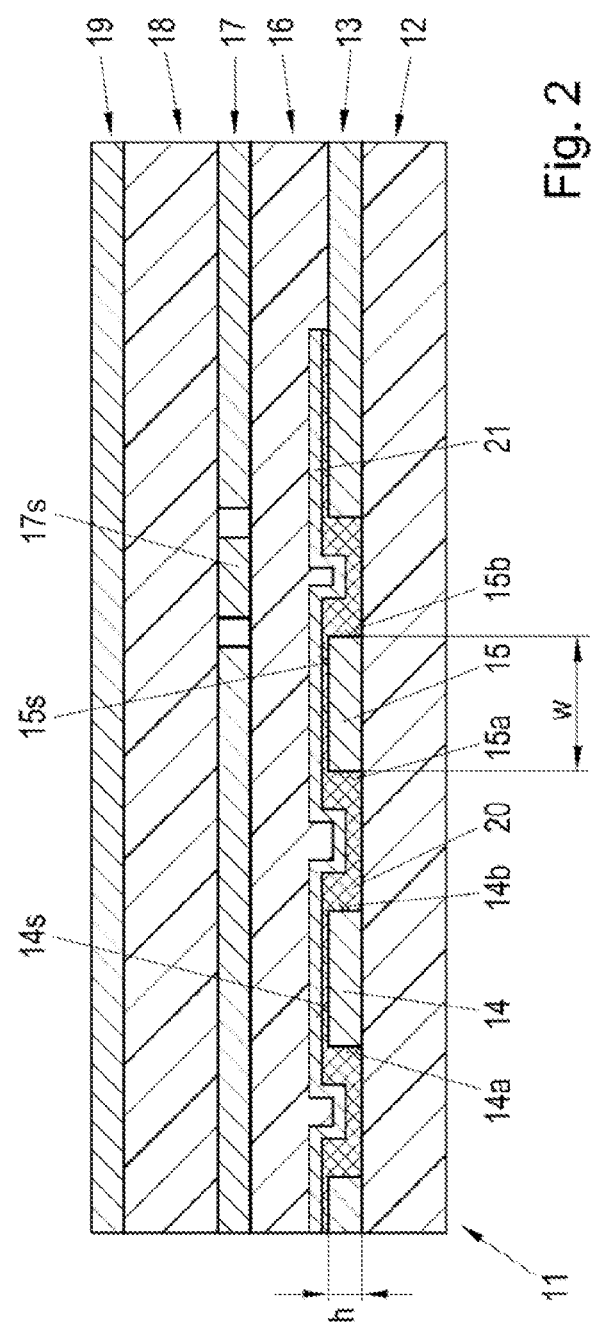
FIG. 2 is a schematic cross-sectional view of a PCB according to the invention having two signal lines.

A printed circuit board 11 according to the invention, as shown in FIG. 2, comprises a bottom layer, namely a support core layer 12, made of a dielectric material, as for instance a FR 4 material or polyimide. Next layer is a first conductive layer 13, built on the support core layer 12, the conductive layer being patterned and having in the present example two signal lines 14, 15, extending in a direction perpendicular to the plane of FIG. 2 and having a height h and a width w. The signal lines 14, 15, for example, may serve as differential signal lines, preferable with a usual impedance of 90-110 ohm, however it should be clear that the invention is not restricted to differential signal lines and may include only one line or more than two signal lines.

The support core layer 12 with the structured conductive layer 13 is followed by a first insulation layer of dielectric material, namely a first prepreg-layer 16. Next follows a second conductive layer 17 covered by a second insulation layer, namely a second prepreg-layer 18. In the example shown conductive layer 17 is structured and comprises for instance a signal line 17s. Top layer of circuit board 11 is a third conductive layer 19. Conductive layers 17 and 19 may be patterned too, having conductor paths, not shown in the drawings. Here it is to remark that FIG. 2 only illustrates a part of a PCB with the features essential for the invention. In general PCB 11 will have larger size and will not be limited to a certain number of layers. For instance a PCB may consist only of layers 12 to 17, omitting layer 18 and 19. Furthermore PCB will have vias or microvias interconnecting conductor paths of different layers.

Signal lines 14, 15 are covered by a dielectric film 20, followed by a thin conductive layer 21, whereby the dielectric film covers at least one surface 14s, 15s and both sides 14a, 14b; 15a, 15b of the signal lines. The thin conductive layer 21 extends, separated by said dielectric film 20, over the at least one surface 14s, 15s with a width w of both signal lines 14, 15 and at least partially over the height h of both sides 14a, 14b; 15a, 15b of the signal lines.

In a preferred embodiment dielectric film 20 is an epoxy film. The dielectric film 20 may be a screen printed film or a laminated film. In another recommendable embodiment the dielectric film 20 is an ink jetted film. After structuring the thin dielectric film 20 the thin conductive layer is applied by screen-printing, laminating or inkjet print.

It is clear for an expert that the solution described above is very advantageous with respect to reduced electromagnetic interference and/or crosstalking, e.g. between signal lines 14, 15 and signal line 17s.

Concerning the thin conductive layer 21 it has been found, that good results and an easy production can be achieved if this layer 21 is made of carbon paste, of silver paste or of copper paste.

PCB 11 may also be a flex type PCB or a rigid-flex type PCB and in this cases other materials for the dielectric layers may and thinner conducting layers may be used at least for flexible parts of the PCB.

While the foregoing description is directed to various preferred embodiments of the invention, it should be noted that variations and modifications will be apparent to the skilled person without departing from the scope of the invention, defined by the annexed claims.

What is claimed is:

1. A printed circuit board comprising conductive layers separated by insulation layers of dielectric material, at least one conductive layer being patterned and having one signal line embedded in insulation material, characterized in that at least two signal lines are embedded in insulation material and covered by a dielectric film, followed by a conductive layer, whereby the dielectric film covers at least one surface and both sides of the at least two signal lines and the conductive layer extends, separated by the dielectric film, over the at least one surface of the at least two signal lines and at least partially along the height of both sides of the signal lines, and that it comprises at least a support core layer, a structured first conductive layer including the at least two signal lines with the dielectric film and the conductive layer arranged on the support core layer, followed by a first prepreg-layer, and a second conductive layer, comprising a signal line.

2. A printed circuit board according to claim 1, characterized in that the dielectric film is an epoxy film.

3. A printed circuit board according to claim 2, characterized in that the dielectric film is a screen printed film.

4. A printed circuit board according to claim 2, characterized in that the dielectric film is a laminated film.

5. A printed circuit board according to claim 2, characterized in that the dielectric film is an ink jetted film.

6. A printed circuit board according to claim 5, characterized in that the conductive layer is made of carbon paste.

7. A printed circuit board according to claim 5, characterized in that the conductive layer is made of silver paste.

8. A printed circuit board according to claim 5, characterized in that the conductive layer is made of copper paste.

9. A printed circuit board according to claim 8, characterized in that the second conductive layer is followed by a second prepreg-layer and a third conductive layer.

* * * * *